United States Patent [19]

Huang et al.

[11] Patent Number: 5,617,573
[45] Date of Patent: Apr. 1, 1997

US005617573A

[54] STATE SPLITTING FOR LEVEL REDUCTION

[75] Inventors: Alan Y. Huang, San Jose; Steven K. Knapp, Santa Clara; Sanjeev Kwatra, Sunnyvale, all of Calif.

[73] Assignee: Xilinx, Inc., San Jose, Calif.

[21] Appl. No.: 247,445

[22] Filed: May 23, 1994

[51] Int. Cl.⁶ .................................................. G11C 13/00
[52] U.S. Cl. ............................ 395/376; 326/46; 326/17
[58] Field of Search ............................... 395/775; 326/46, 326/40, 17

[56] References Cited

U.S. PATENT DOCUMENTS

Re. 34,363  8/1993  Freeman ................................. 307/465
T943,001    6/1974  Mennone .
4,706,216  11/1987  Carter .................................... 365/94

OTHER PUBLICATIONS

Roy L. Adler et al., Algorithms for Sliding Block Codes, IEEE Trans. on Info. Theory, vol. IT–29, Jan. '83 pp. 5–16.
Randal E. Bryant, Graph–Based Algorithms for Boolean Function Manipulation, IEEE Trans. on Comp., Aug. '86 pp. 677–691.
Preas, Bryan and Lorenzetti, Michael, *Physical Design Automation of VLSI Systems*, The Benjamin/Cummings Publishing Company, Inc., Menlo Park, Ca., pp. 74–75. Copyright 1988.

*Primary Examiner*—Jack B. Harvey
*Assistant Examiner*—Jeffrey K. Seto
*Attorney, Agent, or Firm*—Jeanette S. Harms

[57] ABSTRACT

A method of state splitting in a state machine includes determining a number N of logic levels, i.e. CLB levels, for each state in a state machine. Number N is equal to $N_{i-1} + \log_k f_i$ wherein "k" is the number of input lines to a CLB, "i" is a particular node in a particular hierarchial level in the Boolean logic, and "f" is the number of fanin transitions to the particular node. An average number N(AV) as well as a maximum number N(MAX) of CLBs to implement the states in the state machine are also determined. Then, predetermined exit criteria are checked. One exit criterion includes determining that the maximum number N(MAX) is not associated with a state register, but is instead associated with an output, for example. Another exit criterion includes providing a ratio by dividing the maximum number N(MAX) by the average number N(AV). If the ratio is less than or equal to a split-factor, then this exit criterion is met. In one embodiment, the split factor is between 1.5 and 2.0. Yet another exit criterion includes determining that the state being analyzed has one or two fanin transitions. If none of the exit criteria are met, then the state associated with the maximum number N(MAX) is split into at least two states. The method is further optimized by repeating all steps until at least one exit criterion is met. State splitting in accordance with the present invention typically reduces the levels of CLBs by approximately 20%, thereby significantly reducing delay in the state machine.

10 Claims, 7 Drawing Sheets

STATE SPLITTING FOR LEVEL REDUCTION

BACKGROUND OF THE INVENTION

1. Field of the Invention

The present invention relates to state machines and in particular to a method of state splitting for increasing device speed.

2. Description of the Related Art

State machines are well known in the art. State machines are sequential logic systems whose output signals are a function of previous and present input signals, in contrast to combinational logic systems whose output signals are a function of present input signals alone. State machines typically include one or more storage elements and occupy a plurality of states which are determined by input signals and the contents of one or more storage elements. A state machine moves sequentially between states, i.e. one state becomes inactive and another state becomes active, in response to the input signals and transition rules established by combinational logic which defines a logic path between the states. A state machine is typically incorporated into a circuit which includes combinational logic and sequential logic circuitry, and frequently serves as a controller for the rest of the circuit.

State machine design typically starts with the translation of a concept into a "paper design," usually in the form of a state diagram which is a pictorial description of the state relationships. FIG. 1 illustrates a state machine 100 which transitions through six states: state 101, state 102, state 103, state 104, state 105, and state 106. Arrows to and from states 101–106 indicate the transitions between states. The input condition that causes a particular state transition is indicated by the first bit written next to each arrow. The second bit written next to each arrow represents the output condition. Equations 1–6 further describe state machine 100.

$$\text{State } 101 = \bar{a}(\text{State } 101 + \text{State } 102 + \text{State } 103 + \text{State } 104 + \text{State } 105 + \text{State } 106) \quad \text{(Eq. 1)}$$

$$\text{State } 102 = a(\text{State } 101 + \text{State } 106) \quad \text{(Eq. 2)}$$

$$\text{State } 103 = a(\text{State } 102) \quad \text{(Eq. 3)}$$

$$\text{State } 104 = a(\text{State } 103) \quad \text{(Eq. 4)}$$

$$\text{State } 105 = a(\text{State } 104) \quad \text{(Eq. 5)}$$

$$\text{State } 106 = a(\text{State } 105) \quad \text{(Eq. 6)}$$

wherein $a$ indicates the input bit is a logic 1 and $\bar{a}$ indicates the input bit is a logic 0. Referring to FIG. 1 and Equation 5 for example, state 105 occurs only if a logic 1 as the input bit is provided in state 104. Similarly, referring to FIG. 1 and Equation 1, state 101 occurs if a logic 0 as the input bit is provided in any of states 101–106. The input bits are explained in further detail in reference to FIG. 2. The transitions that produce a particular state are called the fanin transitions of the state. Thus, for example, state 101 has six fanin transitions, whereas state 102 has two fanin transitions.

The actual hardware used to implement state machine 100 consists of flip-flops, referred to as state registers, and gates, referred to as combinational logic. State registers store the current state until the next state is calculated, and the combinational logic performs functions that calculate the next state based on the present state and the present value of the input bits. For example referring to FIGS. 1 and 2, the hardware to implement state machine 100 includes state registers 211 and combinational logic 210.

State registers 211 include flip-flops 201–206, whereas combinational logic 210 includes function generators 212A–212D, 213A, 213B, and 214. In one embodiment, these function generators are implemented using logic gates. For example, function generators 212A–212D in this embodiment are AND gates; function generators 213A and 213B each include an OR gate which provides a signal to an AND gate. The AND gate receives another input signal (signal "a") from a source external to the state machine; and function generator 214 is an OR gate. Note that in Equations 1–6, the "+" indicates an OR function and no symbol indicates an AND function. In another embodiment, the above-referenced function generators are implemented using look-up tables which are well known in the art and therefore not described in detail herein.

The states in state machine 100 are represented by setting certain values in the set of state registers 211 via combinational logic 210. This process is conventionally called state encoding. As shown in FIG. 2, each state is implemented with zero or more function generators and an associated flip-flop. For example, state 101 is implemented with function generators 213A and 214 as well as flip-flop 201. Similarly, state 105 is implemented with function generator 212C and flip-flop 205. Implementing state machine 100 by providing a flip-flop for each state is called "one-hot" encoding. In other words, only one flip-flop of flip-flops 201–206 stores a logic one (all other flip-flops store a logic zero).

One-hot encoding is particularly applicable to state machines implemented with field programmable gate arrays (FPGAs) which have a register-rich architecture and fanin-limited function generators. FPGAs are described in detail in U.S. Reissue Pat. No. Re. 34,363, reissued on Aug. 31, 1993, which is herein incorporated by reference in its entirety. FPGAs include a plurality of configurable logic blocks (CLBs) which are interconnected to one another via an interconnect array. In one embodiment, each CLB includes at least one function generator and at least one flip-flop, hence the register-rich designation. This CLB embodiment is described in detail in U.S. Pat. No. 4,706,216, issued Nov. 10, 1987, which is herein incorporated by reference in its entirety.

Each function generator in a CLB receives a predetermined number of input signals dependent on its FPGA architecture, hence the fanin-limited designation. With one-hot encoding, a state machine having a state with a large number of fanin transitions is implemented by a circuit having at least two sequentially coupled CLBs (i.e. multiple levels of logic). For example referring to FIG. 1, state 101 receives six input signals. Assuming each function generator of a CLB receives a maximum of five input signals, then at least two levels of CLBs are required to implement state 101. Thus, as shown in FIG. 2, state 101 is implemented with sequentially coupled function generators 213A and 214, thereby logically necessitating two CLB levels (one for each function generator). Multiple levels of CLBs significantly reduce the speed of performing a logic function because each level of logic becomes valid only after the previous levels have become valid. Therefore, a need arises for a method of reducing logic levels, thereby reducing the delay of performing a logic function.

SUMMARY OF THE INVENTION

In accordance with the present invention, a method of reducing state machine delay includes splitting a state having a large number of fanin transitions. The state splitting in the present invention includes transforming a state machine diagram into a Boolean logic network which includes root, intermediate, and leaf nodes. These nodes have associated fanin input lines which have a substantial correspondence to input lines of a physical configurable logic block (CLB) in a particular FPGA architecture.

One of the steps performed in accordance with the present invention is determining a number N of levels of configurable logic blocks (CLBs) needed to implement portions of the state machine. Number N is estimated to be equal to $N_{i-1} + \log_k f_i$ wherein "i" refers to a particular node in a particular hierarchial level in the Boolean logic, "k" is the number of input lines to a CLB for a particular FPGA architecture, and "f" is the number of fanin input lines to that particular node. To determine the number of CLB levels required by a state machine, all hierarchial levels in the Boolean logic network must be considered. Splitting a state reduces the number of CLB levels required for implementing the state, but increases the number of fanin transitions of subsequent states. Thus, an average number N(AV) as well as a maximum number N(MAX) of levels of CLBs to implement the states in the state machine are also determined.

Predetermined exit criteria are then checked. In one embodiment, one exit criterion includes determining that the maximum number N(MAX) is not associated with a state register of a state, but is instead associated with an output pin, for example. In this case, the speed of the state machine is limited by the delay in a path leading to the output pin, and state splitting cannot be used to reduce the state machine delay. Another exit criterion includes providing a ratio of the maximum number N(MAX) to the average number N(AV). Specifically, if the maximum number N(MAX), divided by the average number N(AV), is less than or equal to a split-factor SF, then this exit criterion is met. In one embodiment, the split factor SF is between 1.5 and 2.0. Yet another exit criterion includes determining that the state being analyzed either has two fanin transitions, wherein one fanin transition is from itself or has only one fanin transition. Thus, splitting this state would also not reduce the number of CLB levels.

If none of the exit criteria are met, then the state associated with the maximum number N(MAX) of levels of CLBs is split into two states. In one embodiment, the splitting results in two states having a substantially equal number of fanin transitions. The method is further optimized by repeating all steps until any one of the exit criterion is met.

Reducing the number of logic levels (hereinafter referred to as CLB levels) significantly increases the speed of performing a logic function. Specifically, state splitting in accordance with the present invention typically reduces the maximum number of levels of CLBs by approximately 20%, thereby significantly increasing the speed of the state machine.

DETAILED DESCRIPTION OF THE DRAWINGS

In accordance with the present invention, a method of reducing state machine delay includes splitting a state having a large number of fanin transitions. This state splitting technique reduces the number of high fanin transitions, thereby effectively reducing the number of CLB levels which in turn minimizes state machine delay.

To reduce high fanin in accordance with the present invention, the number of levels of CLBs required to implement a portion of a state machine is determined based on the multi-level logic representation of the combinational logic function of the state. The multi-level logic representation is obtained using common cubes extraction. For example, referring back to Equation 1, a basic equivalent equation is:

$$\text{State } 101 = \bar{a} \text{ State } 101 + \bar{a} \text{ State } 102 + \bar{a} \text{ State } 103 + \bar{a} \text{ State } 104 + \bar{a} \text{ State } 105 + \bar{a} \text{ State } 106 \quad \text{(Eq.7)}$$

Figure 3A:
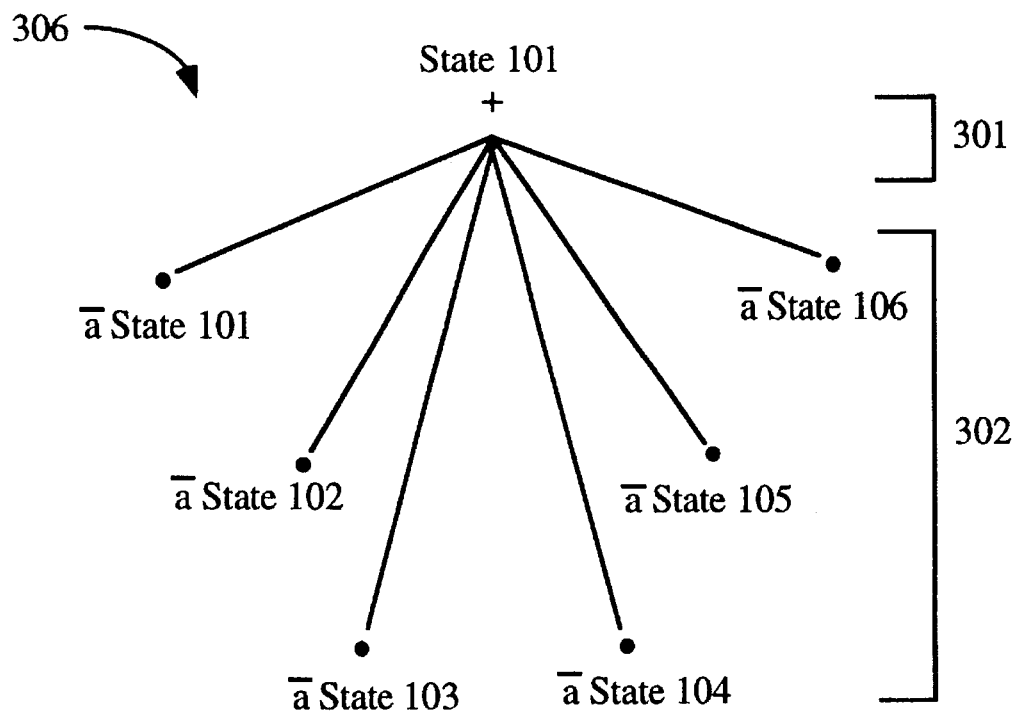
FIG. 3A illustrates a two-level, Boolean logic network representing Equation 1.
Figure 3B:
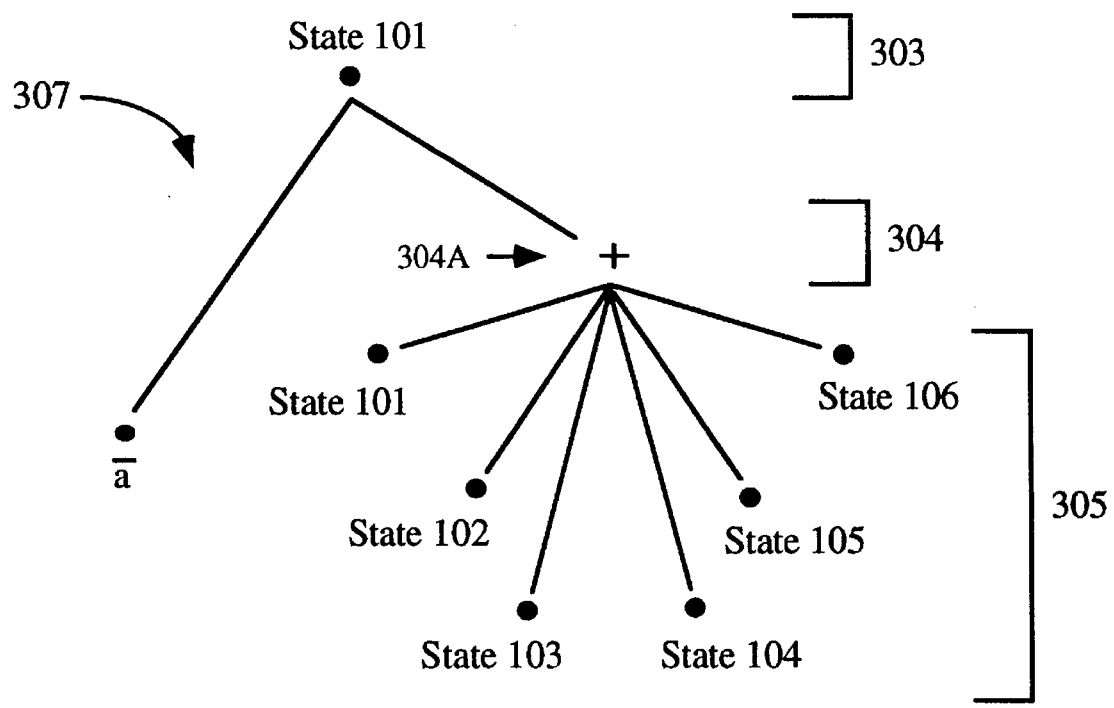
FIG. 3B shows a multi-level, Boolean logic network representing Equation 1 after common cubes extraction.

In common cubes extraction, a common literal (i.e. cube) $\bar{a}$ is factored (i.e. extracted) out of each product term of Equation 7, thereby resulting in Equation 1. Common cubes extraction is well known in the art and therefore is not described in detail herein. In a mutli-level logic representation, intermediate nodes are introduced to build up a more compact logic. For example, referring to FIG. 3A, Equation 7 is represented by a Boolean logic network 306 having two logic levels: a leaf level (also referred to as a "depth zero" level) 302 and a root level (in this network a "depth one" level) 301. In contrast, referring to FIG. 3B, Equation 1 (following common cubes extraction of Equation 7) is represented by a Boolean logic network 307 having three logic levels: a root level (in this network a "depth two" level) 303, an intermediate level (in this network a "depth one" level) 304, and a leaf level 305.

In the present invention, the number of levels of CLBs is estimated using the following equation:

$$N_i = N_{i-1} + \log_k f_i \quad \text{(Eq. 8)}$$

wherein i refers to a particular node in a particular hierarchial level in the Boolean logic, k is the nummber of input lines to a CLB (a constant for a particular FPGA architecture), and f is the number of fanin input lines to that particular node. Thus, referring to intermediate node 304A of Boolean logic network 307 of FIG. 3B, $N_{i-1}$ is zero (no CLBs are required at depth zero, i.e. the leaf level), k is equal to five, and $f_i$ is equal to six. Note that at intermediate levels, the logarithmic function is at the floor, i.e. rounded to the lower integer. Therefore, in this example, the number of CLB levels N is equal to 1 (i.e. $\log_5$ FIG. 3C illustrates a modified Boolean logic network 308 which includes a CLB 310 that receives five fanin input lines from states 101–105.

However, state 106 requires a state register of an additional CLB to be implemented. Thus, in accordance with the present invention, the nodes at the next depth are examined.

Figure 3C:
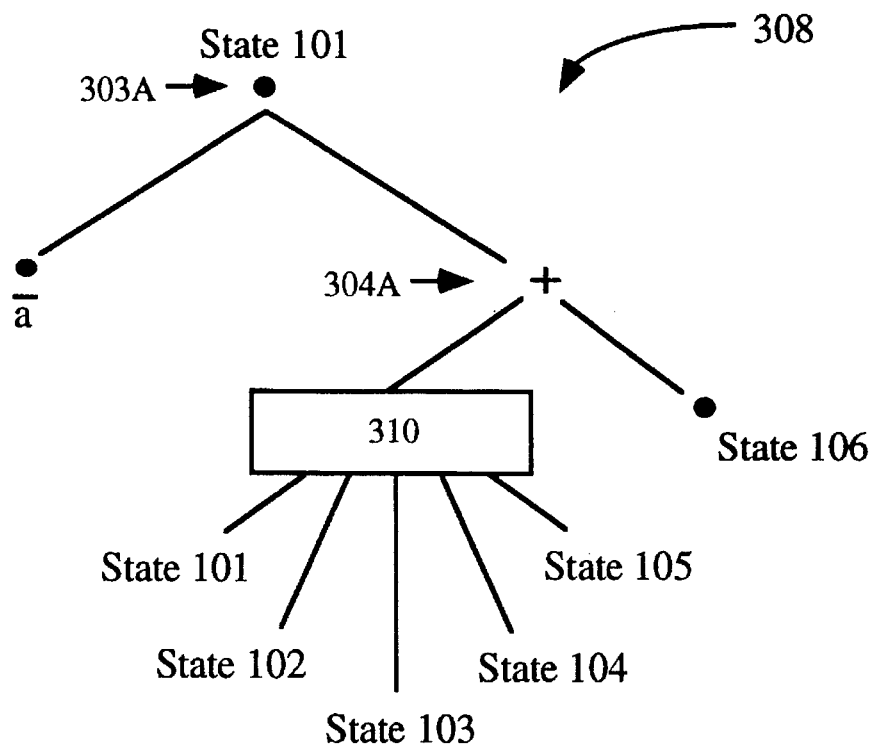
FIG. 3C illustrates the Boolean logic network of FIG. 3B including a CLB at an intermediate node.
Figure 3D:
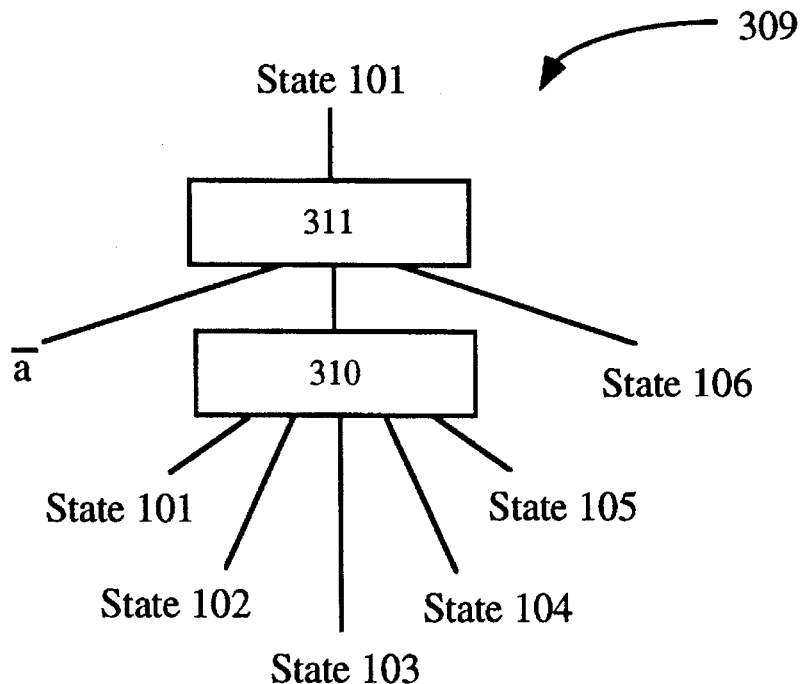
FIG. 3D shows the Boolean logic network of FIG. 3B including two CLBs.

Specifically referring to root node 303A of modified Boolean logic network 308 of FIG. 3C, $N_{i-1}$ is one (CLB 310 is required at the previous depth), k is equal to five, and $f_i$ is equal to three. Note that at the root level, the logarithmic function is at the ceiling, i.e. rounded to the higher integer. Therefore, in this example, the number of CLB levels N is equal to 2 (i.e. $1+\log_5 (3)$). FIG. 3D illustrates a CLB 311 which receives three fanin input lines from State 106, CLB 310, and literal $\bar{a}$.

Figure 6:
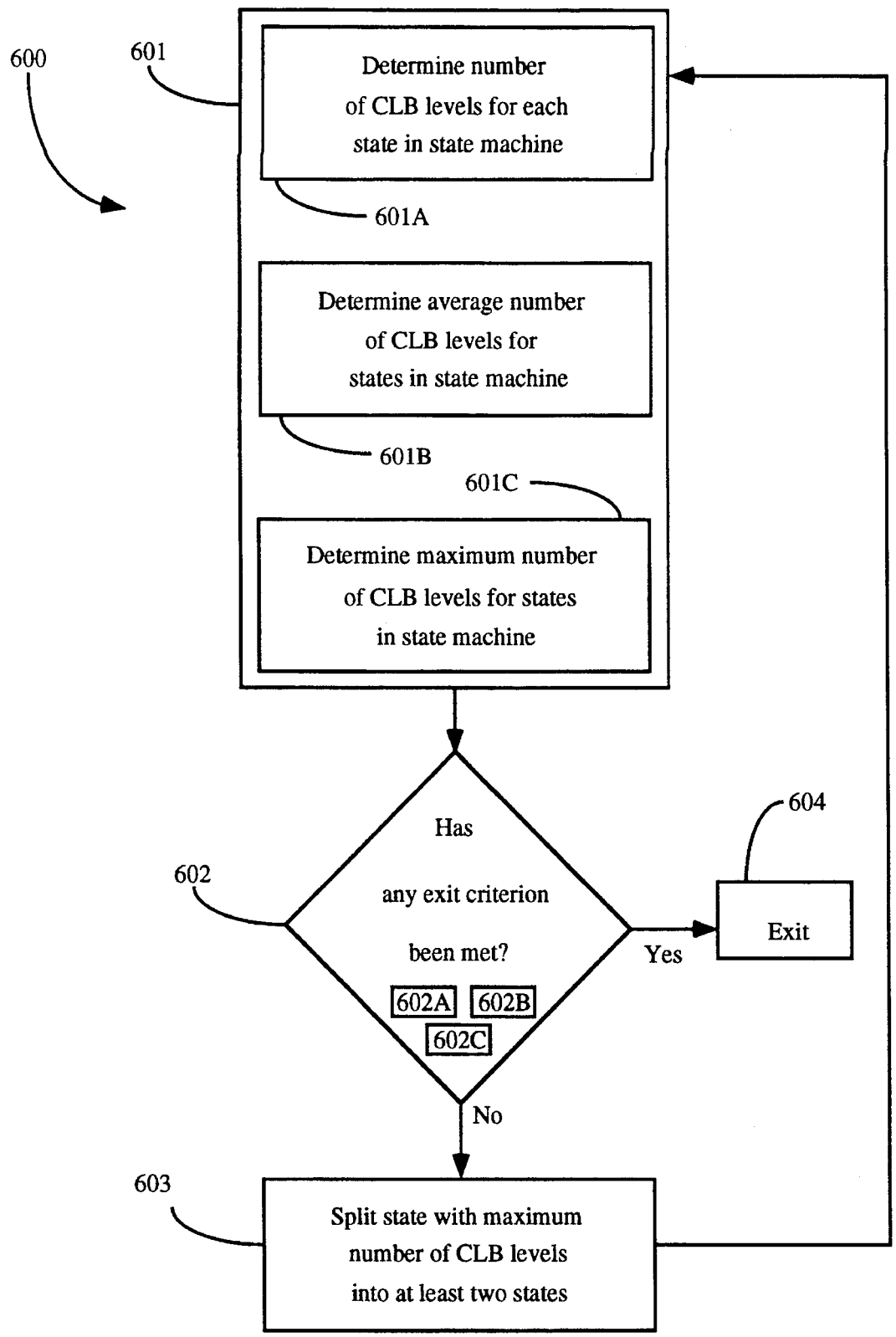
FIG. 6 illustrates a flow diagram for state splitting in accordance with the present invention.

In further accordance with the present invention and referring to flow diagram 600 of FIG. 6, three interrelated steps are included in step 601. Specifically, a number N (above-defined) is determined in step 601A for at least one node at the intermediate or root level. Splitting a first state reduces the number of CLB levels required for implementing the first state, but increases the number of fanin transitions to subsequent states. Thus, an average number N(AV) as well as a maximum number N(MAX) of levels of CLBs to implement the state machine are also determined in steps 601B and 601C, respectively. Typically, state splitting is useful if N(MAX) is greater than N(AV).

Then, in step 602, predetermined exit criteria 602A, 602B, and 602C are checked. In one embodiment, exit criterion 602A includes determining that the maximum number N(MAX) is not associated with a state register of a state, but is instead associated with an output pin, for example. In this case, the speed of the state machine is limited by the delay in a path leading to the output pin, and state splitting will not reduce the number of CLB levels, i.e. not affect state machine performance.

Another exit criterion 602B includes providing a ratio of the maximum number N(MAX) to the average number N(AV). Specifically, if the maximum number N(MAX), divided by the average number N(AV), is less than or equal to a split-factor SF, then the exit criterion is met. Note that a typical value for split-factor SF is between 1.5 and 2.0. Yet another exit criterion 602C includes determining that the state being analyzed either has two fanin transitions, wherein one fanin transition is from itself or has only one fanin transition. Thus, splitting this state would also not reduce the number of CLB levels.

If none of the above-referenced exit criteria are met, then the state associated with the maximum number N(MAX) is split into at least two states in step 603. In one embodiment of the present invention, the split is performed with a conventional FiducciaMetheyes procedure with the goal to minimize the number of logic levels needed to implement either of the new states created by the split. This procedure is described in detail by B. Preas and M. Lorenzetti, in *Physical Design Automation of VLSI Systems*, pages 74–75, published in 1988 which is herein incorporated by reference in its entirety. In one embodiment, the splitting provides two states with a substantially equal number of fan-in transitions. To optimize the above-described method, steps 601–603 are repeated until any one of the exit criterion is met, wherein the state splitting routine is exited in step 604.

Figure 1:
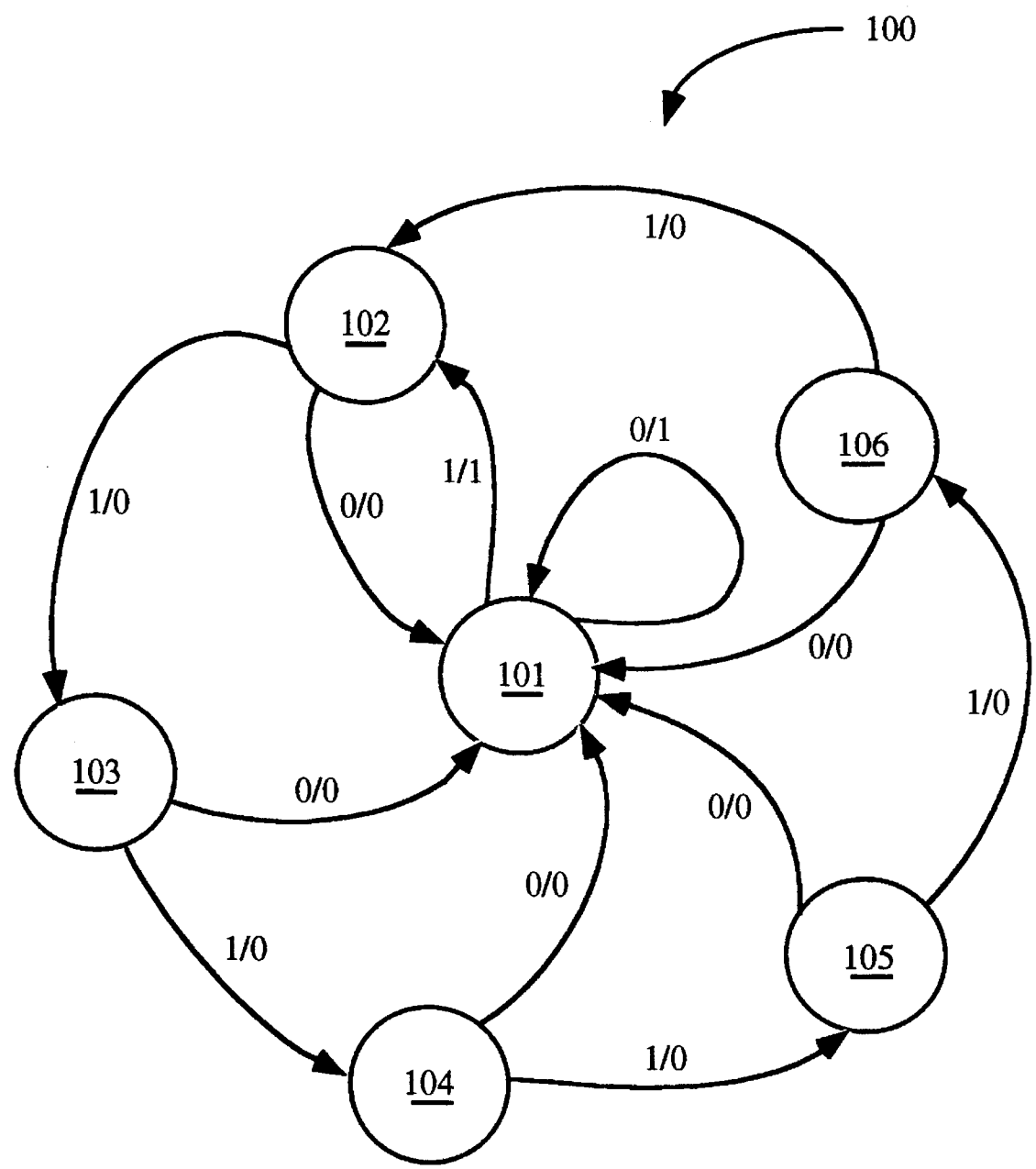
FIG. 1 illustrates a common state machine having six states.
Figure 2:
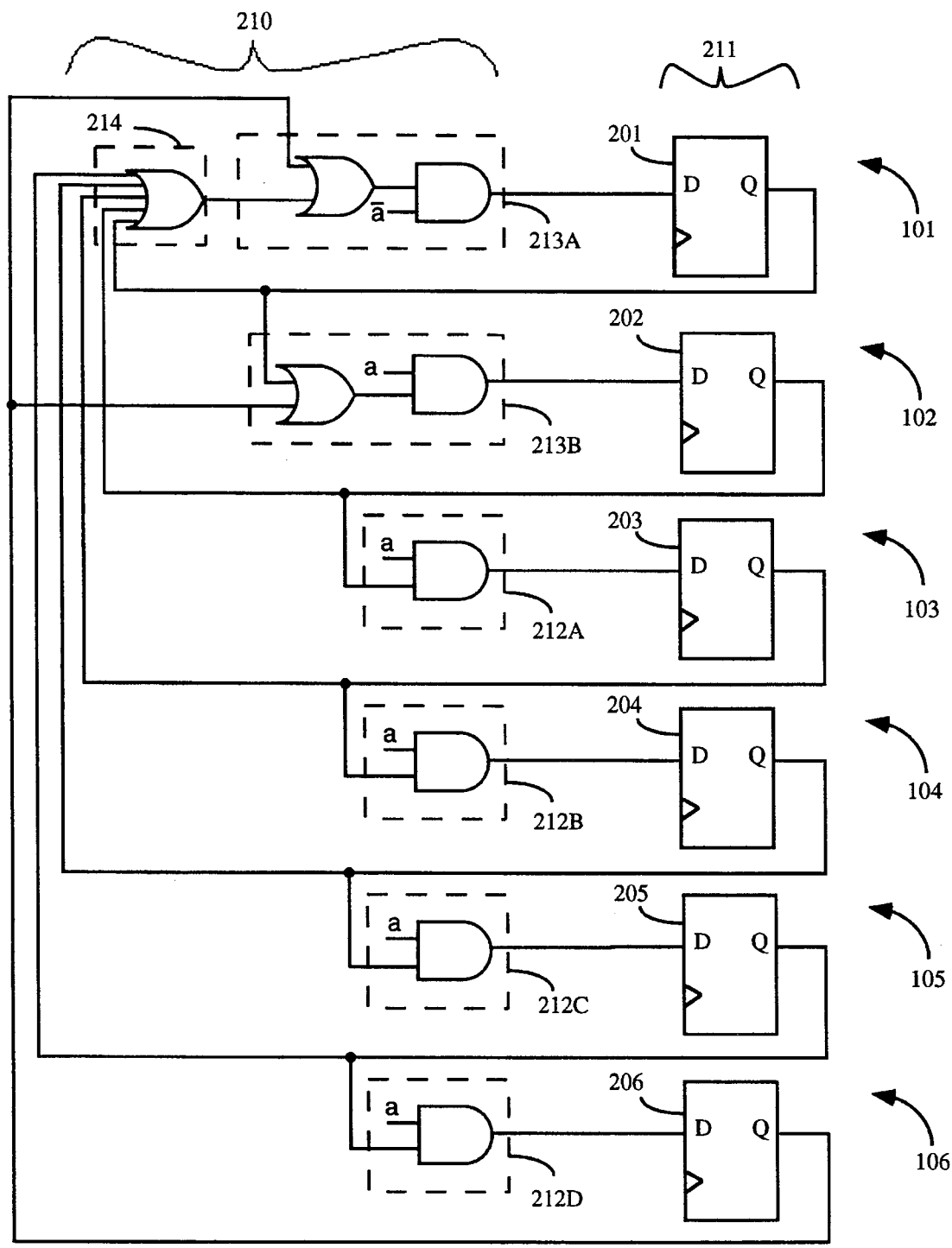
FIG. 2 shows illustrative combinational logic and state registers for implementing the state machine of FIG. 1.

Thus, in accordance with the present invention, state splitting breaks up a state with high fanin transitions into two states with lower fanin transitions. For example, the present invention splits state 101 (having a fanin transition of six) (FIG. 1) into two states, 101A and 101B (having fanin transitions of three and four, respectively) as shown in state machine 100' of FIG. 4. A comparison of FIG. 2 to FIG. 5 shows that the function provided by function generators 213A and 214 (FIG. 2) is identical to the function provided by function generators 513A and 513C (FIG. 5). Equations 9–15 further describe state machine 100' of FIG. 4.

State 101A=$\bar{a}$(State 101A+State 102+State 103)  (Eq. 9)

State 101B=$\bar{a}$(State 101B+State 104+State 105+State 106) (Eq. 10)

State 102=a(State 101A+State 101B +State 106)  (Eq. 11)

State 103=a(State 102)  (Eq. 12)

State 104=a(State 103)  (Eq. 13)

State 105=a(State 104)  (Eq. 14)

State 106=a(State 105)  (Eq. 15)

wherein a indicates the input bit is a logic 1 and $\bar{a}$ indicates the input bit is a logic 0. Thus, state 101A occurs if a logic 1 as the input bit is provided in states 101A, 102, or 103. Similarly, state 101B occurs if a logic 0 as the input bit is provided in states 101B, 104, 105, or 106. State 102 occurs if a logic 0 as the input bit is provided in states 101A, 101B, or 106. Finally, states 103, 104, 105, and 106 occur if a logic 0 as the input bit is provided in states 102, 103, 104, or 105, respectively.

The hardware to implement state machine 100' includes state registers 511 and combinational logic 510 which are shown in FIG. 5. State registers 511 include flip-flops 501A, 501B, and 502–506, whereas combinational logic 510 includes function generators 512A–512D and 513A–513C. In one embodiment, these function generators are implemented using look up tables which perform functions of particular logic gates. For example, function generators 512A–512D in this example perform AND gate functions and function generators 513A–513C perform functions of OR gates that provide signals to AND gates (each AND gate receiving two input signals and outputting a signal which is provided to a flip-flop).

Figure 4:
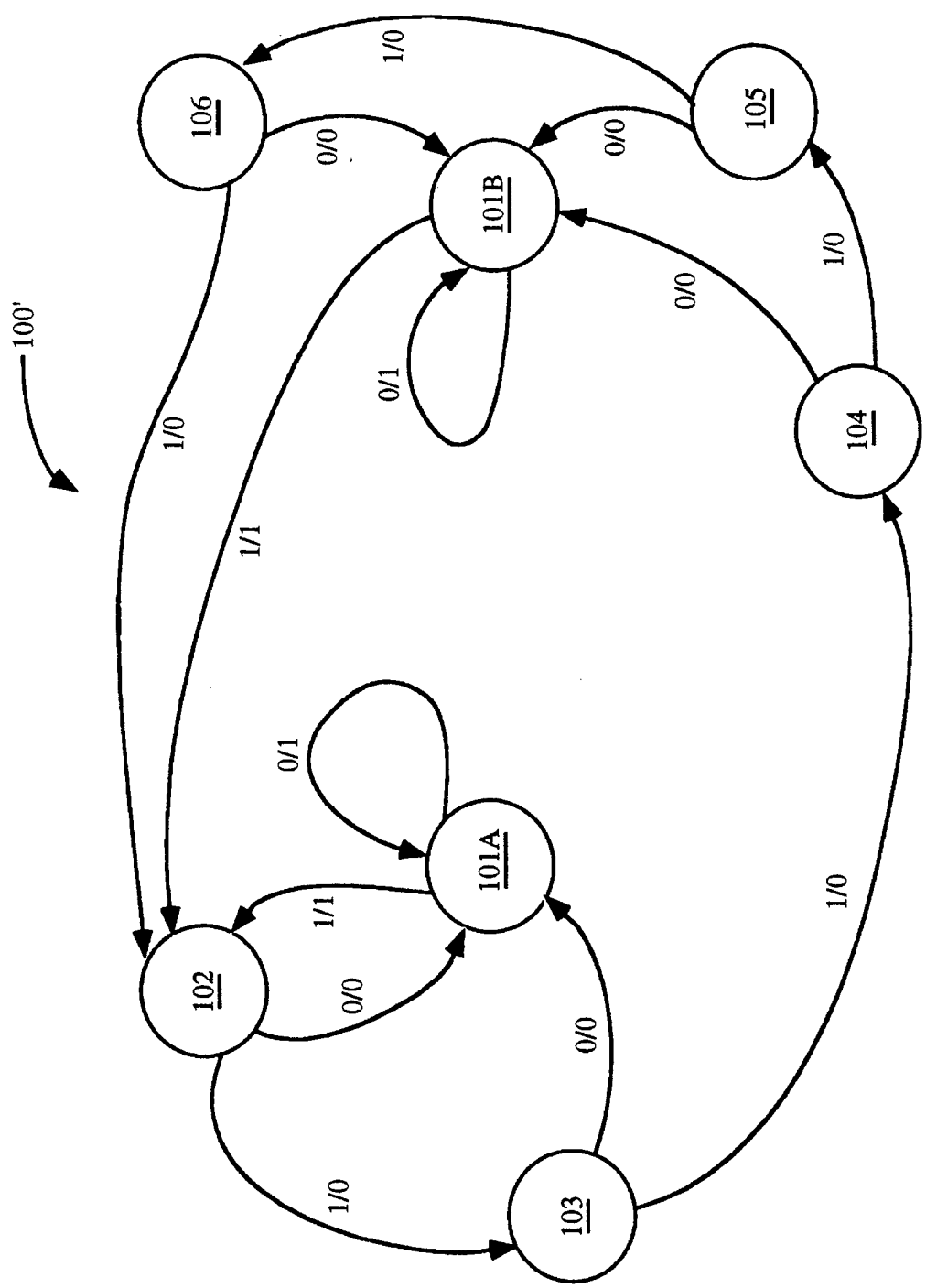
FIG. 4 illustrates the state machine of FIG. 1 split in accordance with the present invention.
Figure 5:
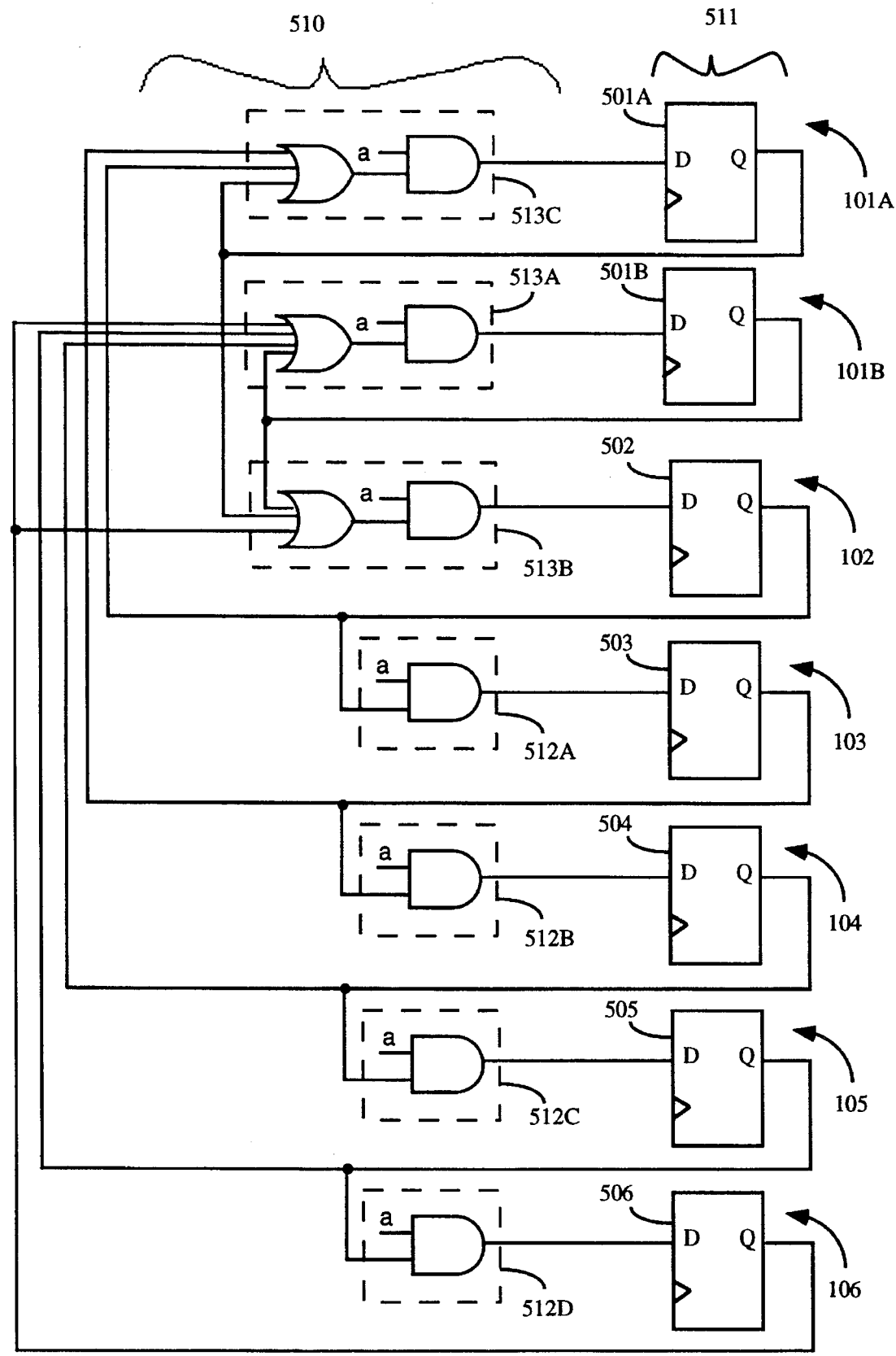
FIG. 5 shows illustrative combinational logic and state registers for implementing the state machine of FIG. 3.

In accordance with the present invention and referring to FIGS. 4 and 5, state 101 which receives six input signals (FIG. 1) is split into two states: a state 101A which receives three input signals and a state 101B which receives four input signals. Once again assuming each function generator in a CLB receives a maximum of five input signals, then only one level of CLBs is required to implement state 101A or state 101B. Thus, as shown in FIG. 5, state 101A is implemented with function generator 513C, and state 101B is implemented with function generator 513A.

State splitting in accordance with the present invention typically reduces the levels of logic by approximately 20%. This reduction in the levels of logic significantly minimizes delays in the state machine.

As mentioned previously, one-hot encoding is typically used in FPGA applications. Thus, state splitting in accordance with the present invention (which relies on one-hot encoding) provides particular advantages for many FPGA applications. Note that other encoding systems benefit less from the state splitting techniques that are in accordance with the present invention.

The above-described embodiments of the present invention are illustrative only and not limiting. Other embodiments of the present invention will be apparent to those skilled in the art. The present invention is set forth in the appended claims.

We claim:

1. A method of state splitting in a state machine including the steps of:

(a) determining a number N of logic levels for each state in said state machine, wherein said number N is equal to:

$N_{i-1}+\log_k f_i$ wherein k is the number of input lines to a CLB, i is a particular node in a particular hierarchial level in a Boolean logic network representing said state machine, and f is the number of fanin transitions to said particular node;

(b) determining an average number N(AV) of CLB levels of the states in said state machine;

(c) determining the state having a maximum number N(MAX) of CLB levels in said state machine;

(d) splitting the state associated with said maximum number N(MAX) into two states if predetermined exit criteria are not met.

2. The method of state splitting of claim 1 wherein said predetermined exit criteria includes dividing said maximum number N(MAX) by said average number N(AV) to obtain a ratio, and determining whether said ratio is greater than a split factor.

3. The method of state splitting of claim 2 wherein said split factor is between approximately 1.5 and approximately 2.0.

4. The method of state splitting of claim 2 wherein said split factor is approximately 1.5.

5. The method of state splitting of claim 2 wherein said predetermined exit criteria includes determining whether said maximum number N(MAX) is associated with a state register.

6. The method of state splitting of claim 5 wherein said predetermined exit criteria includes determining whether said state having said maximum number N(MAX) provides less than two fanin transitions.

7. The method of state splitting of claim 2 wherein step (d) results in two states having a substantially equal number of fan-in transitions.

8. The method of state splitting of claim 2 wherein step (d) is performed using a Fiduccia-Metheyes procedure.

9. The method of state splitting of claim 1 wherein step (a) includes rounding to the lower integer if N is estimated at an intermediate level.

10. The method of state splitting of claim 1 wherein step (a) includes rounding to the upper integer if N is estimated at a root level.

* * * * *

UNITED STATES PATENT AND TRADEMARK OFFICE
CERTIFICATE OF CORRECTION

PATENT NO. : 5,617,573
DATED : April 1, 1997
INVENTOR(S) : Alan Y. Huang, Steven K. Knapp & Sanjeev Kwatra It is certified that error appears in the above-identified patent and that said Letters Patent is hereby corrected as shown below:

Col. 4, line 50, "$N_{i=Ni-1}+\log_k f_i$" should read --$N_i=N_{i-1}+\log_k f_i$--.

Col. 4, line 52, "nummber" should read --number--.

Col. 4, line 62, "(i.e. $\log_5$ FIG. 3C" should read --(i.e. $\log_5 (6)$). FIG. 3C--.

Col. 5, line 46, "FiducciaMetheyes" should read --Fiduccia-Metheyes--.

Signed and Sealed this

Fourteenth Day of April, 1998

*Attest:*

BRUCE LEHMAN

*Attesting Officer*  *Commissioner of Patents and Trademarks*